(12) United States Patent
Sawashima et al.

(10) Patent No.: US 12,145,179 B2
(45) Date of Patent: Nov. 19, 2024

(54) SUBSTRATE TREATING APPARATUS

(71) Applicant: SCREEN Holdings Co., Ltd., Kyoto (JP)

(72) Inventors: Jun Sawashima, Kyoto (JP); Takahiro Yamaguchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 300 days.

(21) Appl. No.: 17/496,826

(22) Filed: Oct. 8, 2021

(65) Prior Publication Data

US 2022/0134390 A1 May 5, 2022

(30) Foreign Application Priority Data

Oct. 29, 2020 (JP) .................. 2020-181303

(51) Int. Cl.
*H01L 21/67* (2006.01)
*B08B 3/08* (2006.01)
*B08B 13/00* (2006.01)

(52) U.S. Cl.
CPC ............... *B08B 3/08* (2013.01); *B08B 13/00* (2013.01)

(58) Field of Classification Search
CPC ................. B08B 3/08; H01L 21/67017; H01L 21/67023; H01L 21/67028; H01L 21/6704; H01L 21/67051; H01L 21/67063; H01L 21/67075; H01L 21/6708; H01L 21/67155; H01L 21/67161
See application file for complete search history.

(56) References Cited

U.S. PATENT DOCUMENTS

| 10,332,761 | B2 | 6/2019 | Kobayashi et al. |
| 10,910,240 | B2 | 2/2021 | Muramoto |
| 2008/0023049 | A1* | 1/2008 | Matsumoto ......... H01L 21/6708 134/61 |
| 2010/0218791 | A1* | 9/2010 | Tanaka ............. H01L 21/67028 134/135 |

(Continued)

FOREIGN PATENT DOCUMENTS

| JP | 2015-088734 A | 5/2015 |
| JP | 2016-149459 A | 8/2016 |

(Continued)

OTHER PUBLICATIONS

Office Action dated Aug. 17, 2022 for corresponding Taiwan Patent Application No. 110137274.

*Primary Examiner* — David G Cormier
(74) *Attorney, Agent, or Firm* — OSTROLENK FABER LLP

(57) ABSTRACT

Disclosed is a substrate treating apparatus for performing treatment with supply of fluids to a substrate. The apparatus includes a first treatment housing, a treating section provided inside of the first treatment housing and configured to treat a substrate placed on a mount table with the fluids, a first fluid supplying section located on a first lateral side of the treating section, seen from a front side face where maintenance is performed to the first treatment housing, and configured to supply a first fluid of the fluids to the treating section, and a second fluid supplying section located on a second lateral side of the treating section, seen from the front side face, and configured to supply a second fluid of the fluids to the treating section.

14 Claims, 10 Drawing Sheets

(56) References Cited

U.S. PATENT DOCUMENTS

| | | | |
|---|---|---|---|
| 2012/0175819 A1* | 7/2012 | Miya | H01L 21/02052 |
| | | | 425/445 |
| 2012/0312336 A1* | 12/2012 | Itoh | H01L 21/67748 |
| | | | 134/103.3 |
| 2013/0020284 A1* | 1/2013 | Osada | B08B 3/041 |
| | | | 156/345.21 |
| 2013/0340796 A1* | 12/2013 | Kawano | H01L 21/02057 |
| | | | 134/28 |
| 2015/0090305 A1 | 4/2015 | Wakiyama et al. | 134/153 |
| 2018/0061688 A1 | 3/2018 | Minamida et al. | |
| 2019/0172732 A1 | 6/2019 | Naohara et al. | |
| 2022/0076968 A1* | 3/2022 | Marumoto | H01L 21/30604 |
| 2022/0187856 A1* | 6/2022 | Toyomasu | B24B 37/04 |

FOREIGN PATENT DOCUMENTS

| | | |
|---|---|---|
| JP | 2017-163103 A | 9/2017 |
| JP | 2018-032723 A | 3/2018 |
| JP | 2018-142694 A | 9/2018 |
| JP | 2018-182271 A | 11/2018 |
| JP | 2019-102653 A | 6/2019 |
| KR | 10-2016-0101871 A | 8/2016 |
| KR | 10-2018-0128382 A | 12/2018 |
| TW | 202030774 A | 8/2020 |

\* cited by examiner

SUBSTRATE TREATING APPARATUS

BACKGROUND OF THE INVENTION

(1) Field of the Invention

The present invention relates to a substrate treating apparatus for performing treatment by supplying a fluid such as a treatment liquid or treatment gas on a substrate, such as a semiconductor wafer, a substrate for a liquid crystal display or for an organic electroluminescence (EL) display, a glass substrate for a photomask, an optical disk substrate, a magnetic disk substrate, a ceramic substrate, a substrate for a solar cell, or the like (hereinafter, simply referred to as substrate).

(2) Description of the Related Art

Examples of currently-used apparatus of this type includes one including a housing, a treating section, and a supplying section. See, for example, Japanese Unexamined Patent Application Publication No. 2017-163103 (FIG. 1). The housing includes the treating section and the supplying section. The treating section performs treatment to substrates with various treatment liquids. The supplying section supplies the various treatment liquids to the treating section. The supplying section is located adjacent to only one side of the treating section in a horizontal direction, seen from a front side face, which is accessible for an operator when performing maintenance of the apparatus. The one side is, for example, a right side. The supplying section supplies two types of treatment liquids (e.g., acids, alkalis) to the treating section, for example.

The housing includes a load/unload opening configured to deliver a substrate to and from the treating section on a back side face opposite to a front side face of the apparatus. The treating section is provided with a mount table configured to place a substrate at the center thereof seen in plan view. The supplying section is provided with a nozzle configured to supply a treatment liquid. The nozzle has a distal end that pivots between a supply position above the mount table and a standby position away from the mount table. Such pivot is made about a proximal end of the nozzle. In such a construction with two nozzles, the nozzles are located in a dispersed manner in the treating section so as not to interfere with each other.

The proximal ends of the nozzles are dispersed around the mount table in the treating section. Specifically, one of the nozzles has a proximal end that is located rightward seen from the front side face of the treating section. The one nozzle is located along one side extending from the front side face to the back side face of the treating section in plan view. The one nozzle includes a pipe from the supplying section along the front side face, via which pipe a treatment liquid is supplied. The other nozzle has a proximal end that is located leftward seen from the front side face of the treating section. The other nozzle is located along one side extending from the front side face to the back side face of the treating section in plan view. That is, the other nozzle is spaced apart from the supplying section relative to the one nozzle. In other words, the other nozzle is located opposite to the supplying section across the mount table of the treating section.

However, the conventional example with such constructions has the following problems. That is, in the currently-used apparatus, the pipe is connected from the supplying section along the back side face while the other nozzle keeps away the pipe of the one nozzle located along the front side face. Consequently, since the other nozzle is located at the farthest position from the front side face where maintenance is performed, it becomes difficult to access the pipe thereof. This results in a problem of poor maintainability. Moreover, if the pipe is connected along the back side face, the length thereof becomes large. When the length of the pipe becomes large in such a manner, other problem arises that an amount of the stagnating treatment liquid increases or that an amount of the treatment liquid whose temperature is not controlled increases.

SUMMARY OF THE INVENTION

The present invention has been made regarding the state of the art noted above, and its one object is to provide a substrate treating apparatus that achieves enhanced maintainability and a short pipe length with devised arrangement.

The present invention is constituted as stated below to achieve the above object.

One aspect of the present invention provides a substrate treating apparatus for performing treatment with supply of fluids to a substrate. The apparatus includes: a first treatment housing; a treating section provided inside of the first treatment housing and configured to treat a substrate placed on a mount table with the fluids; a first supplying section located on a first lateral side of the treating section, seen from a front side face where maintenance is performed to the first treatment housing, and configured to supply a first fluid of the fluids to the treating section; and a second supplying section located on a second lateral side of the treating section, seen from the front side face, and configured to supply a second fluid of the fluids to the treating section.

According to the embodiment of the present invention, the substrate treating apparatus includes the treating section in the first treatment housing, and also includes the first supplying section configured to supply the first fluid to the treating section and the second supplying section configured to supply the second fluid to the treating section. The first supplying section is located on the first lateral side of the treating section, seen from the front side face in the first treatment housing, and the second supplying section is located on the second lateral side of the treating section, seen from the front side face in the first treatment housing. Accordingly, neither the first supplying section nor the second supplying section is located on the inaccessible back side face opposite to the front side face. As a result, both the first supplying section and the second supplying section are made easily accessible from the front side face, achieving enhanced maintainability. Moreover, the first supplying section and the second supplying section can each have a reduced pipe length.

Moreover, it is preferred in the aspect of the present invention that the first supplying section includes a first nozzle configured to supply the first fluid to a substrate placed on the mount table, and a first fluid supplying section configured to supply the first fluid to the first nozzle, and that the second supplying section includes a second nozzle configured to supply the second fluid to a substrate placed on the mount table, and a second fluid supplying section configured to supply the second fluid to the second nozzle.

The first nozzle and the first fluid supplying section are located on the first lateral side of the treating section seen from the front side face in the first treatment housing. The second nozzle and the second fluid supplying section are located on the second lateral side of the treating section seen from the front side face in the first treatment housing. As a result, the first nozzle, the first fluid supplying section, the second nozzle, and the second fluid supplying section are made easily accessible from the front side face, achieving enhanced maintainability.

Moreover, it is preferred in the aspect of the present invention that the first nozzle includes a proximal end configured to supply the first fluid from the first fluid supplying section, an eject part in fluid communication with the proximal end, and an arm connecting the proximal end to the eject part, the proximal end is located closer to the first fluid supplying section than the mount table, and the eject part swings about the proximal end between a supply position above the mount table and a standby position away from the mount table, the second nozzle includes a proximal end configured to supply the second fluid from the second fluid supplying section, an eject part in fluid communication with the proximal end, and an arm connecting the proximal end to the eject part, and the proximal end is located closer to the second fluid supplying section than the mount table, and the eject part swings about the proximal end between a supply position above the mount table and a standby position away from the mount table.

The first nozzle has the proximal end closer to the first fluid supplying section than the mount table. The second nozzle has the proximal end closer to the second fluid supplying section than the mount table. Consequently, the first fluid supplying section can be brought into fluid communication with the proximal end of the first nozzle on the front side face. Moreover, the second fluid supplying section can be brought into fluid communication with the proximal end of the second nozzle on the front side face. This results in reduction in distance for fluid communication, achieving enhanced maintainability.

Moreover, it is preferred in the aspect of the present invention that the first fluid differs from the second fluid.

The first fluid is one selected from an organic solvent, an acid solution, an alkaline solution, and inert gas, for example. The second fluid differs from the first fluid. Various types of fluids can be supplied to the treating section, achieving various treatments.

Moreover, it is preferred in the aspect of the present invention that the first fluid and the second fluid are each a liquid.

The first fluid and the second fluid are each one selected from an organic solvent, an acid solution, and an alkaline solution.

Moreover, it is preferred in the aspect of the present invention that the first fluid supplying section includes a first fluid reservoir configured to store the first fluid and having a feed portion through which the first fluid is fed and a return portion through which the first fluid returns, a supplying pipe in fluid communication with the feed portion of the first fluid reservoir, a collecting pipe in fluid communication with the return portion of the first fluid reservoir, a collecting section provided at the standby position for collecting the first fluid fed through the first nozzle, a discharge pipe in fluid communication with the collecting section for discharging the first fluid collected in the collecting section, a supply branch pipe whose one end is in fluid communication with the supplying pipe and whose other end is in fluid communication with the proximal end, a flow meter configured to determine a flow rate of the first fluid in the supply branch pipe, a flow rate regulating valve provided closer to the proximal end of the supply branch pipe than the flow meter and configured to operate a flow rate of the first fluid in the supply branch pipe, and a supply control valve configured to supply and stop the first fluid, adjusted with the flow rate regulating valve, through the nozzle.

The first fluid supplying section includes the first fluid reservoir, the supplying pipe in fluid communication with the feed portion of the first fluid reservoir, the supply branch pipe branched from the supplying pipe and in fluid communication with the proximal end, the flow meter, the flow rate regulating valve, and the supply control valve. Consequently, the supply control valve can operate supply and stop the first fluid through the nozzle while the flow rate is controlled by the flow rate regulating valve and is monitored with the flow meter.

Moreover, it is preferred in the aspect of the present invention that the flow rate regulating valve is located adjacent to the front side face of the first treatment housing.

The flow rate regulating valve is located adjacent to the front side face of the first treatment housing. This achieves easy maintenance to the flow rate regulating valve.

Moreover, it is preferred in the aspect of the present invention that the first fluid supplying section further includes a return pipe whose one end is in fluid communication with a portion of the supply branch pipe between the supply control valve and the flow rate regulating valve and whose other end is in fluid communication with the collecting pipe, and a return on-off valve provided in the return pipe and configured to permit and block flow of the first fluid in the return pipe, and when the first nozzle is at the standby position, the supply control valve closes and the return on-off valve opens to return the first fluid to the first fluid reservoir via the return pipe for circulating the first fluid.

If the first fluid stagnates for a long period of time in a path of the pipe, contamination may accumulate in the first fluid or components of the pipe may be eluted, leading to reduction in quality. When the first nozzle is at the standby position, the supply control valve closes and the return on-off valve opens to return the first fluid to the first fluid reservoir via the return pipe for circulating the first fluid. Accordingly, there is no possibility that the first fluid stagnates for a long period of time in a path of the pipe. As a result, reduction in quality of the first fluid is suppressible, achieving substrate treatment with a high degree of cleanness.

Moreover, it is preferred in the aspect of the present invention that the substrate treating apparatus further includes a first manual on-off valve provided in the supply branch pipe and configured to manually permit and block flow of the first fluid in the supply branch pipe, and a second manual on-off valve provided in the return pipe and configured to manually permit and block flow of the first fluid in the return pipe.

The flow of the first manual on-off valve and the second manual on-off valve is blocked through manual operation, whereby the first nozzle is separable from the supplying pipe. This achieves maintenance to the first nozzle without stop of supply from the first fluid reservoir.

Moreover, it is preferred in the aspect of the present invention that the first fluid is an organic solvent, the flow meter and the flow rate regulating valve are housed in a shielding container that shields the atmosphere from the surroundings, and the shielding container is internally exhausted.

The flow meter and the flow rate regulating valve provided on the supply branch pipe may serve as an ignition source of volatile gas generated from an organic solvent. Then, the flow meter and the flow rate regulating valve are housed in the shielding container internally exhausted, whereby the volatile gas of the organic solvent can be prevented from stagnating in the shielding container. This achieves an explosion-proof configuration to perform treatment safely.

Moreover, it is preferred in the aspect of the present invention that the first manual on-off valve and the second manual on-off valve are located adjacent to the front side face of the first treatment housing.

The first manual on-off valve and the second manual on-off valve operate flow in the supply branch pipe and the return pipe for maintenance. Consequently, arrangement of the first manual on-off valve and the second manual on-off valve adjacent to the front side face of the first treatment housing achieves easy operation in the maintenance.

Moreover, it is preferred in the aspect of the present invention that the proximal ends of the first nozzle and the second nozzle are located adjacent to the front side face of the first treatment housing.

The first fluid or the second fluid is supplied to the proximal ends. Consequently, arrangement of the proximal end adjacent to the front side face of the first treatment housing achieves easy maintenance for the first fluid or the second fluid.

Moreover, it is preferred in the aspect of the present invention that an exhaust box configured to exhaust gas from the treatment section is located adjacent to the first supplying section.

The exhaust box is provided adjacent to the first supplying section. Consequently, a space adjacent to the first supplying section in the first treatment housing can be used efficiently.

Moreover, it is preferred in the aspect of the present invention that the substrate treating apparatus further includes a second treatment housing located below the first treatment housing, and the second treatment housing includes a treating section provided inside of the second treatment housing and configured to treat a substrate placed on a mount table with the fluids, a first fluid supplying section located on a first lateral side of the treating section, seen from a front side face where maintenance is performed to the second treatment housing, and configured to supply a first fluid of the fluids to the treating section, and a second fluid supplying section located on a second lateral side of the treating section, seen from the front side face, and configured to supply a second fluid of the fluids to the treating section.

Even with the substrate treating apparatus of a multi-stage type where the second treatment housing is located below the first treatment housing, neither the first supplying section nor the second supplying section is located on the inaccessible back side face opposite to the front side face. As a result, both the first supplying section and the second supplying section are made easily accessible from the front side face, achieving enhanced maintainability.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Figure 1:
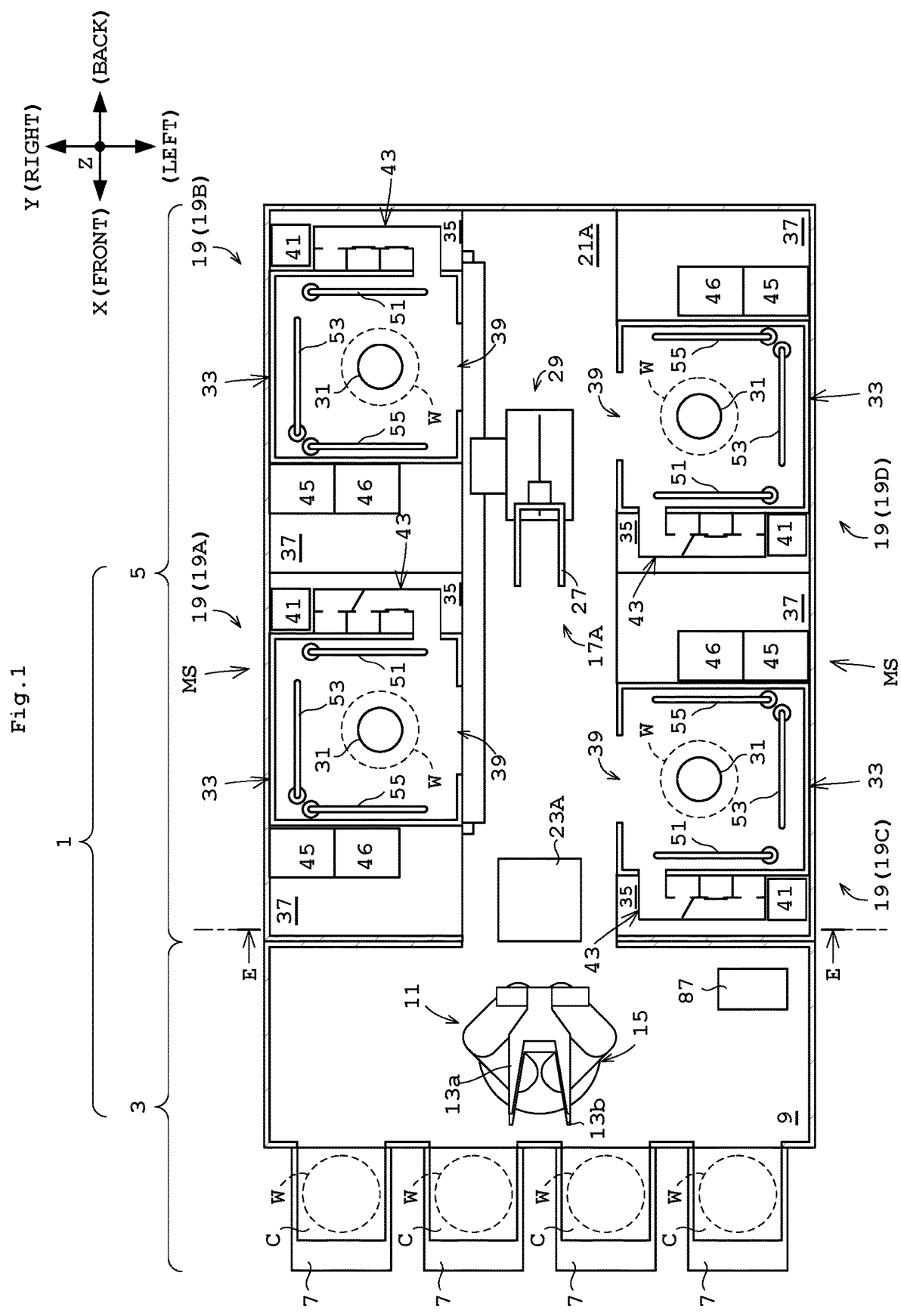
FIG. 1 is a transverse cross-sectional view of a substrate treating apparatus according to one embodiment.
Figure 2:
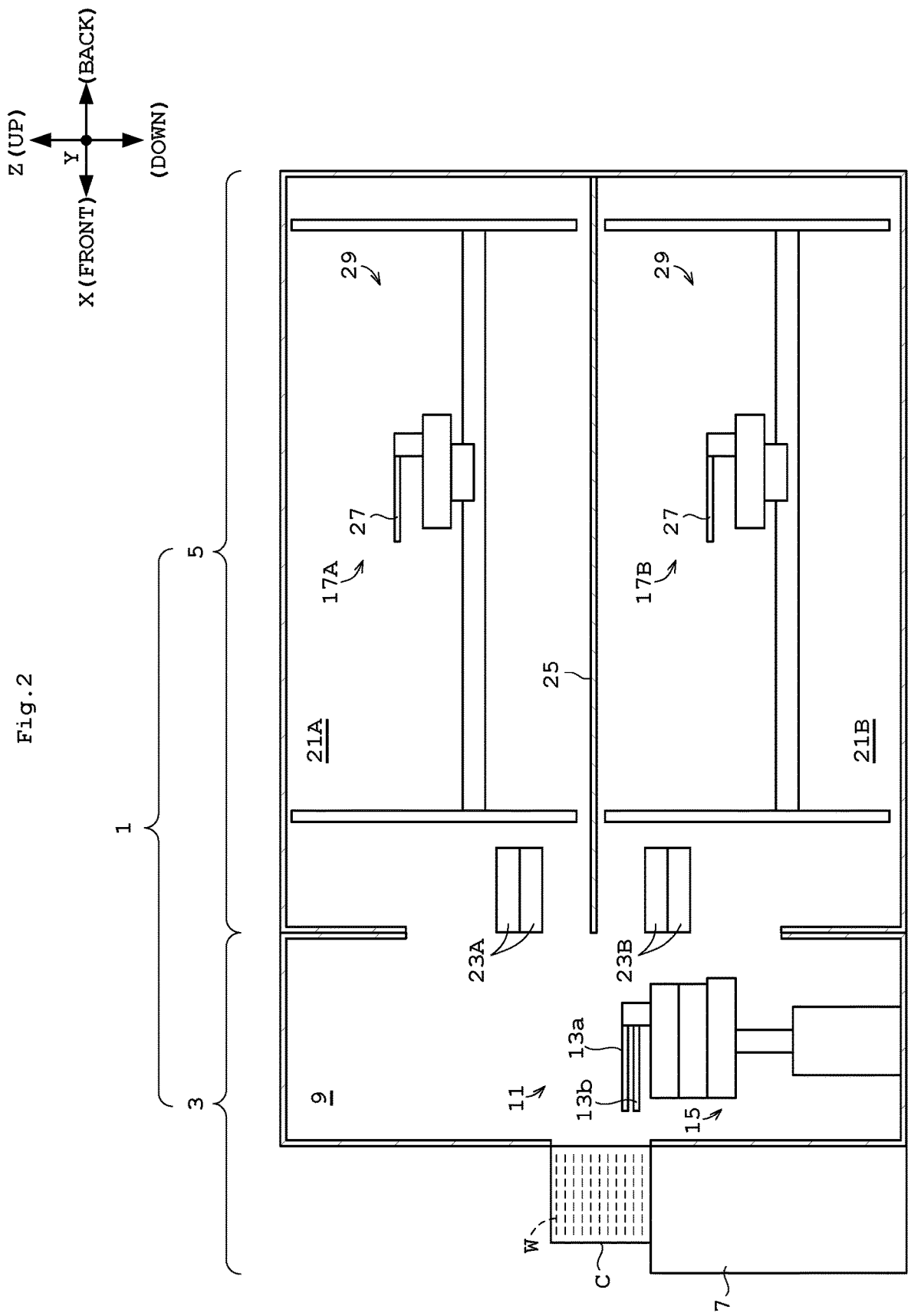
FIG. 2 is a longitudinal cross-sectional view of the substrate treating apparatus in a front-back direction.

The following describes one embodiment of the present invention with reference to drawings. FIG. 1 is a transverse cross-sectional view of a substrate treating apparatus according to one embodiment. FIG. 2 is a longitudinal cross-sectional view of the substrate treating apparatus in a front-back direction X.

Configuration of Substrate Treating Apparatus

A substrate treating apparatus 1 performs treatment on substrates W. Examples of the substrates W include a semiconductor wafer. The substrate W is a substantially thin flat circular plate.

The substrate treating apparatus 1 includes an indexer 3, and a treating block 5. The treating block 5 is connected to the indexer 3. The indexer 3 and the treating block 5 are arranged side by side in a horizontal direction. The indexer 3 delivers a substrate W to and from the treating block 5. The treating block 5 performs treatment with fluids to the substrates W. Here, the fluids are, for example, a treatment liquid and treatment gas.

In this specification, the horizontal direction in which the indexer 3 and the treating block 5 are arranged is referred to as a "front-back direction X" for convenience. One direction of the front-back direction X from the indexer 3 to the treating block 5 is referred to as "forward". The direction opposite to the forward direction is referred to as "rearward". A horizontal direction orthogonal to the front-back direction X is referred to as a "transverse direction Y". Moreover, one direction of the transverse direction Y is referred to as "rightward", as appropriate. The direction opposite to rightward is referred to as "leftward". The perpendicular direction relative to the horizontal direction is referred to as a "vertical direction Z". For reference, the drawings show front, rear, right, left, up, and down, as appropriate. When no distinction is particularly made among "forward", "rearward", "rightward", and "leftward", a simple term "lateral" is to be described.

Construction of Indexer 3

The indexer 3 includes a plurality of carrier platforms 7. In the present embodiment, the indexer 3 includes four carrier platforms 7. The carrier platforms 7 are arranged side by side in a transverse direction Y. The carrier platforms 7 each include one carrier C placed thereon. The carrier C accommodates a plurality of substrates W. The carrier C is, for example, a front opening unified pod (FOUP).

The indexer 3 includes a transportation space 9. The transportation space 9 is located behind the carrier platforms 7. The transportation space 9 extends in the transverse direction Y along the four carrier platforms 7.

The indexer 3 includes one transport mechanism 11. The transport mechanism 11 is arranged in the transportation space 9. The transport mechanism 11 is located behind the carrier platforms 7. The transport mechanism 11 transports a substrate W. The transport mechanism 11 is accessible to the carriers C placed on the carrier platforms 4, respectively.

The transport mechanism 11 includes two hands 13a and 13b, and a hand driving section 15. The hands 13a and 13b each support one substrate W in a horizontal posture. The hand driving section 15 includes an articulated arm to moves the two hands 13a and 13b. The hand driving section 15 moves the two hands 13a and 13b in the front-back direction X, transverse direction Y, and vertical direction Z. The hand driving section 15 moves the two hands 13a and 13b around an axis in the vertical direction Z. The transport mechanism 11 can access carriers C placed on four carrier platforms 4. The transport mechanism 11 does not move itself in the transverse direction Y but is fixed. Only the two hands 13a and 13b are movable in the transverse direction Y.

Construction of Treating Block 5

Reference is now made to FIGS. 1 and 2. The treating block 5 includes two transport mechanisms 17A and 17B and twenty-four (plural) treating units 19, for example. The twenty-four treating units 19 each perform a predetermined treatment to a substrate W, transported by either of the two transport mechanisms 17A and 17B, with a predetermined treatment liquid or treatment gas. The twenty-four treating units 19 are located side by side along transportation paths of the two transport mechanisms 17A and 17B. The twenty-four treating units 19 face each other across the transportation paths in the transverse direction Y, and are also located so as to be stacked in the up-down direction. The following describes the detailed construction of the treating block 5.

The treating block 5 includes a transportation space 21A. The transportation space 21A is located at the middle part of the treating block 11 in the transverse direction Y. The transportation space 21A extends in the front-back direction X. A front part of the transportation space 21A is in connection with the transportation space 9 of the indexer 3.

The treating block 5 includes a substrate platform 23A. The substrate platform 23A is arranged in the transportation space 12A. The substrate platform 23A is located in a front part of the transportation space 12A. The transport mechanism 11 of the indexer 3 is also accessible to the substrate platform 23A. The substrate platform 23A places one or more substrates W thereon.

The treating block 5 includes a transport mechanism 17A. The transport mechanism 17A is arranged in the transportation space 12A. The transport mechanism 17A transports substrates W. The transport mechanism 17A is accessible to the substrate platform 23A.

As shown in FIG. 1, the treating block 5 includes four treating units 19A, 19B, 19C, and 19D. The treating units 19A and 19B are located rightward of the transportation space 21A. The treating units 19A and 19B align along the transportation space 21A in the front-back direction X. The treating unit 19B is located behind the treating unit 19A. The treating units 19C and 19D are located leftward of the transportation space 21A. The treating units 19C and 19D align along the transportation space 21A in the front-back direction X. The treating unit 19D is located behind the treating unit 19C. The two treating units 19A, 19B and the two treating units 19C, 19D are located so as to face each other across the transportation space 21A.

When no distinction is made among the treating units 19A, 19B, 19C, and 19D, they are simply referred to as a treating unit 19. The treating unit 19 performs a treatment to a substrate W.

Reference is now made to FIG. 2. The treating block 5 includes a transportation space 21B in addition to the transportation space 21A. The transportation space 21B is located below the transportation space 21A. The transportation space 21B overlaps the transportation space 21A in plan view. The transportation space 21B has substantially the same shape as the transportation space 21A. The transportation space 21B is also in connection with the transportation space 9 of the indexer 3. When no distinction is made between the transportation spaces 21A and 21B, they are simply referred to as a transportation space 21.

The treating block 5 includes one partition 25. The partition 25 is located below the transportation space 21A and above the transportation space 21B. The partition 25 has a flat plate shape. The partition 25 separates the transportation space 21A and the transportation space 21B.

The treating block 5 includes a substrate platform 23B in addition to the substrate platform 23A. The substrate platform 23B is arranged in the transportation space 21B. The substrate platform 23B is located below the substrate platform 23A. The substrate platform 23B overlaps the substrate platform 23A in plan view. The substrate platform 23B is located at the same position as that of the substrate platform 23A in plan view. The substrate platform 23B is located in a front part of the transportation space 21B. The transport mechanism 11 of the indexer 3 is also accessible to the substrate platform 23B. The substrate platform 23B places one or more substrates W thereon.

The treating block 5 includes a transport mechanism 17B in addition to the transport mechanism 17A. The transport mechanism 17B is arranged in the transportation space 21B. The transport mechanism 17B transports substrates W. The transport mechanism 17B is accessible to the substrate platform 23B.

The transport mechanism 17B has the same configuration as that of the transport mechanism 17A. When no distinction is made between the transport mechanisms 17A and 17B, they are simply referred to as a transport mechanism 17.

Reference is now made to FIGS. 1 and 2. The transport mechanisms 17 each include a hand 27 and a hand driving section 29. The hand 27 supports one substrate W in a horizontal posture. The hand driving section 29 is coupled to the hand 27. The hand driving section 29 moves the hand 27 in the front-back direction X, transverse direction Y, and vertical direction Z. The hand driving section 29 moves the hand 27 around an axis in the vertical direction Z.

Figure 3:
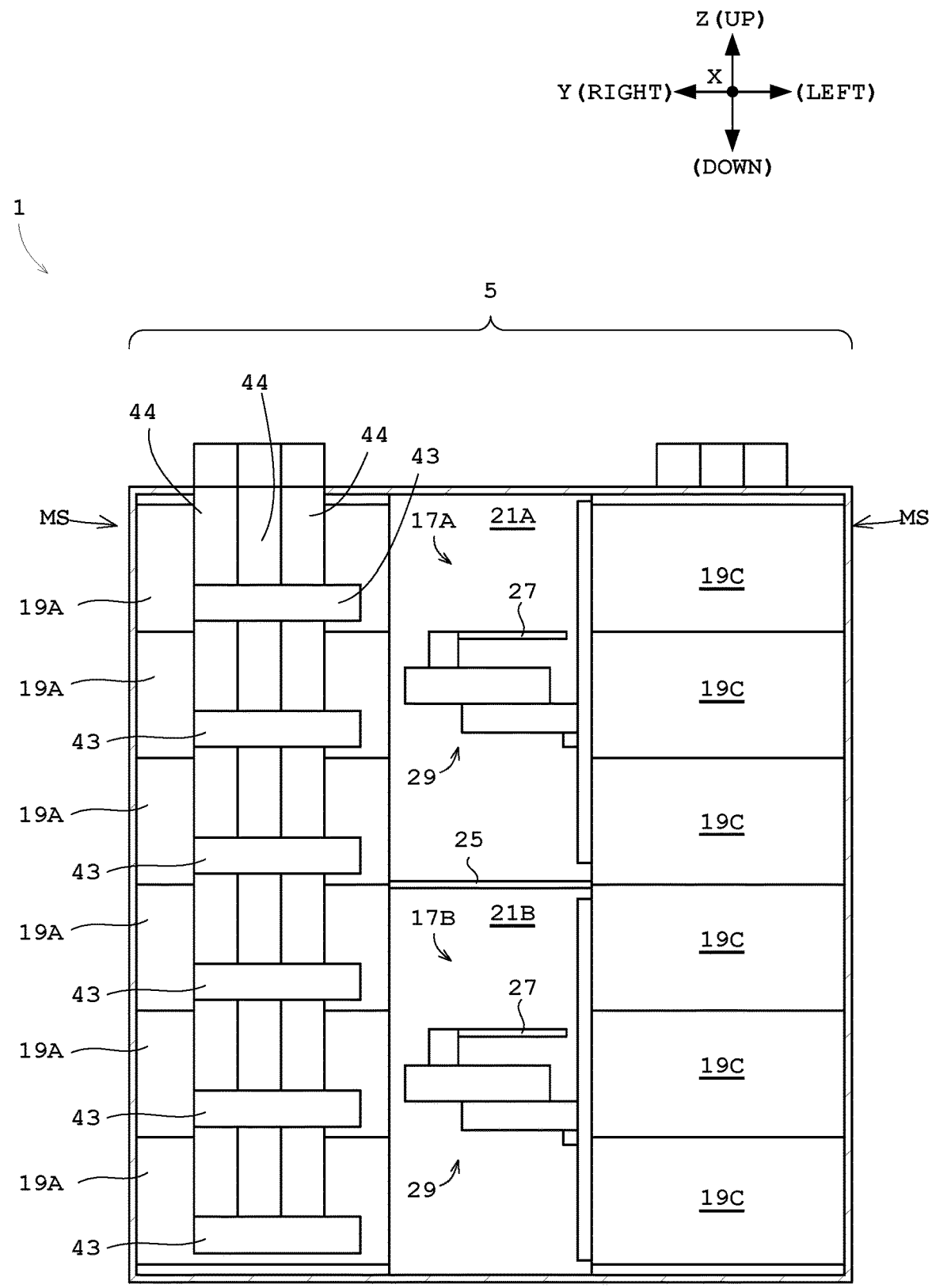
FIG. 3 is a longitudinal cross-sectional view taken along a line indicated by arrows E in FIG. 1.
Figure 4:
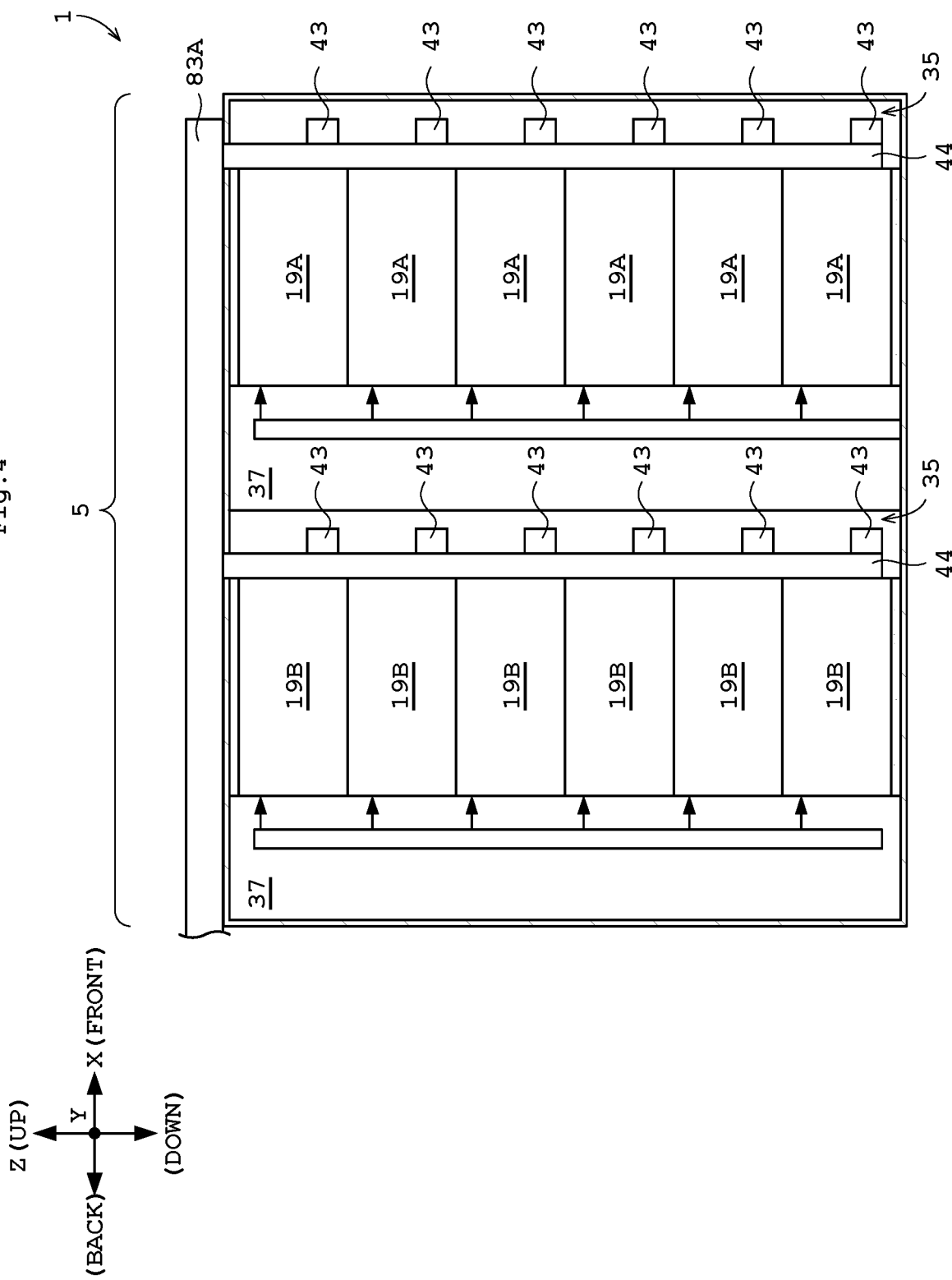
FIG. 4 is a right side view of a right part of the substrate treating apparatus.
Figure 5:
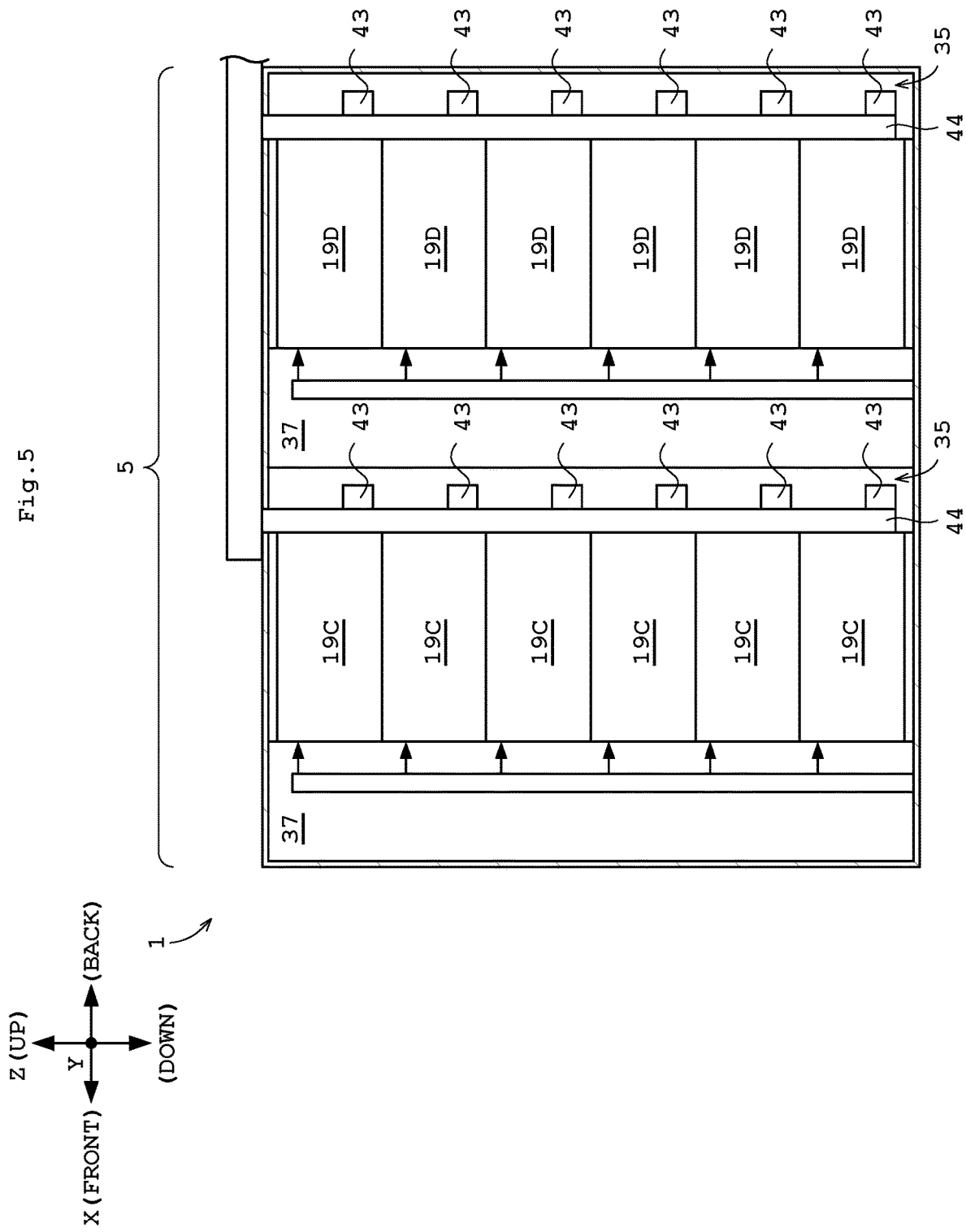
FIG. 5 is a left side view of a left part of the substrate treating apparatus.

Reference is now made to FIGS. 1 to 5. FIG. 3 is a longitudinal cross-sectional view taken along a line indicated by arrows E in FIG. 1. FIG. 4 is a right side view of a right part of the substrate treating apparatus. FIG. 5 is a left side view of a left part of the substrate treating apparatus.

The treating block 5 includes six treating units 19A. The six treating units 19A are located so as to be stacked in the up-down direction. That is, the six treating units 19A align in line in the vertical direction Z. Likewise, the treating block 5 includes six treating units 19B, six treating units 19C, and six treating units 19D. The six treating units 19B, six treating units 19C, and six treating units 19D are located so as to be stacked in the up-down direction.

The transport mechanism 17A in an upper layer in FIG. 2 delivers substrates W to and from upper twelve (four by upper three stages) treating units 19. Moreover, the transport mechanism 17B in a lower layer delivers substrates W to and from lower twelve (four by lower three stages) treating units 19. Here, the transport mechanism 17 is accessible to a mount table 31 of the treating units 19.

Construction of Treating Unit 19

Figure 6:
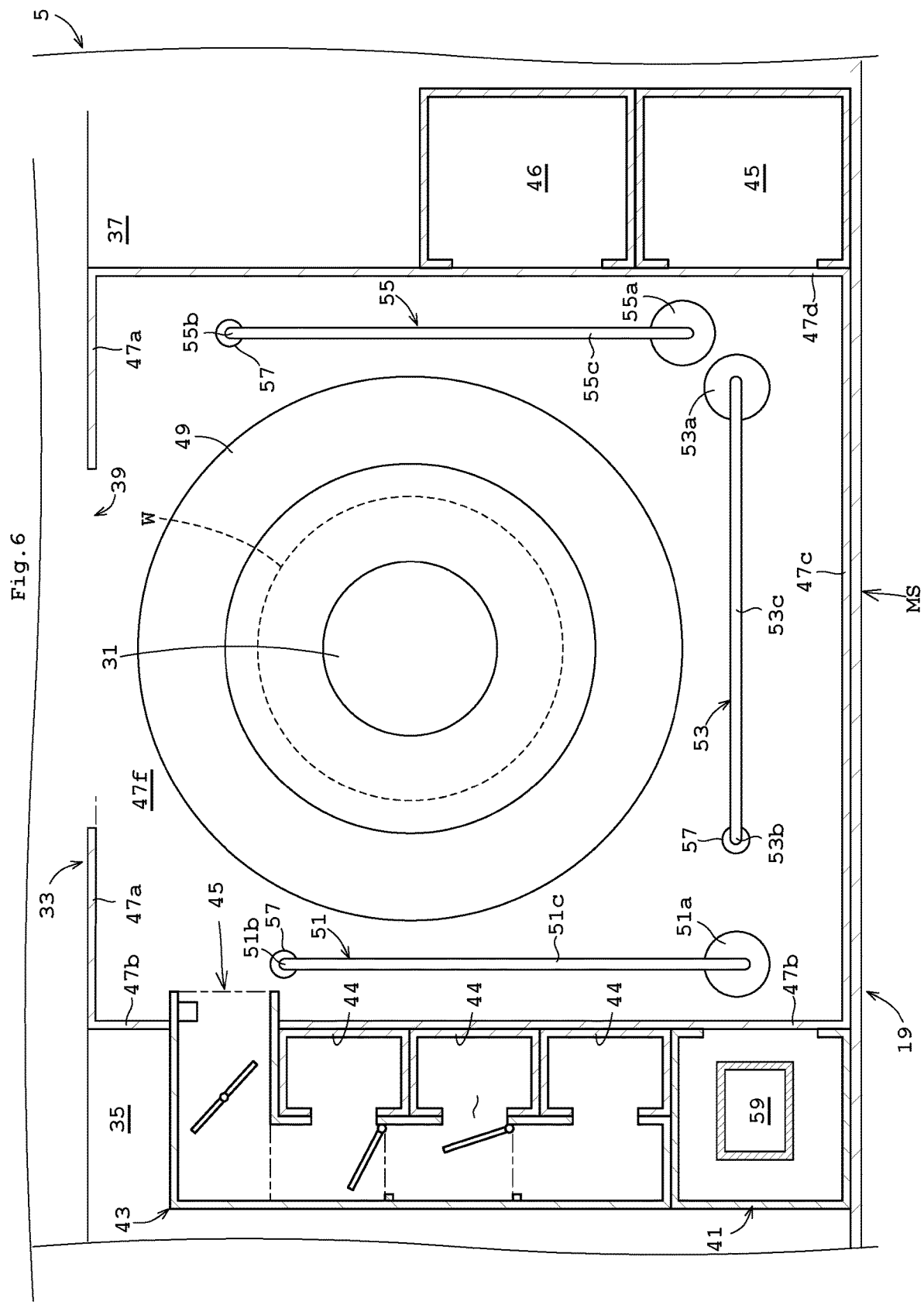
FIG. 6 is a transverse cross-sectional view of a treating unit.

FIG. 6 is a transverse cross-sectional view of the treating unit. The twenty-four treating units 19 each include a treating section 33, a first space 35, and a second space 37. Hereinunder, a treating unit 19 (19C) of the treating units 19 that is located forward and leftward in FIG. 1 is exemplarily described.

The treating section 33 includes a mount table 31 where a substrates W is placed. The mount table 31 rotates while holding the substrate W. The treating section 33 performs treatment to the substrate W rotated and held with the mount table 31. The first space 35 includes a first supplying section 41 configured to supply a first fluid to the treating section 33. The first fluid is, for example, an organic solvent. Moreover, the first space 35 includes an exhaust box 43 configured to switch exhaust of various types. The exhaust box 43 is in communication with the treating section 33 via an exhaust port 45 for exhausting the treating section 33. Moreover, the exhaust box 43 is in communication with three exhaust pipes 44 extending in the up-down direction. The exhaust box 43 exhausts one of the three exhaust pipes 44 through switching operation. The exhaust box 43 is located adjacent to the first supplying section 41 in the first space 35 in the transverse direction Y. The exhaust box 43 is located rightward of the first supplying section 41 in the transverse direction Y.

The second space 37 includes a second supplying section 45 configured to supply a second fluid to the treating section 33. The second fluid is, for example, an alkaline treatment liquid. The alkaline treatment liquid includes, for example, at least one selected from ammonia/hydrogen peroxide solution (SC1), an ammonia water, an ammonium fluoride solution, and tetramethylammonium hydroxide (TMAH). The second space 37 includes a third supplying section 46 configured to supply a third fluid to the treating section 33. Examples of the third fluid include an acid treatment liquid. The acid treatment liquid includes, for example, at least one selected from hydrofluoric acid, a hydrochloric acid/hydrogen peroxide solution, sulfuric acid, a sulfuric acid/hydrogen peroxide solution, fluoro-nitric acid (a mixed liquid of hydrofluoric acid and nitric acid), and hydrochloric acid.

The treating units 19 each include the first space 35 and the second space 37 that are separated from each other in the front-back direction X in front and rear part, respectively, in the treating section 33. Accordingly, the first space 35 and the second space 37 can be used separately for each application and type. This results in enhanced efficient arrangement of pipes of the treatment liquid and the exhaust gas in the first space 35 and the second space 37.

Here, the treating units 19 described above correspond to the "first treatment housing" in the present invention, and treating units 19 below the treating units 19 correspond to the "second treatment housing" in the present invention. The first supplying section 41 described above corresponds to the "first fluid supplying section" in the present invention, and the second supplying section 45 corresponds to the "second fluid supplying section" in the present invention. The first supplying section 41 and the nozzle 51 described above correspond to the "first supplying section" in the present invention, and the second supplying section 45 and the nozzle 53 correspond to the "second supplying section" in the present invention.

Construction of Treating Section 33

The following firstly describes the configuration of the treating section 33. The treating section 33 has a substantial box shape. The treating section 33 is substantially rectangular in plan view, in front view, and in side view.

Reference is now made to FIGS. 3 to 5. The six treating sections 33 in the six treating units 19A are stacked on one another. Likewise, the six treating sections 33 in the six treating units 19B are stacked on one another. The six treating sections 33 in the six treating units 19C are stacked on one another. The six treating sections 33 in the six treating units 19D are stacked on one another. The six treating sections 33 are each adjacent to the transportation space 21.

Reference is now made to FIG. 6. FIG. 6 is a transverse cross-sectional view of the treating unit.

The treating sections 33 each include four lateral walls 47a, 47b, 47c, and 47d, and a base board 47f. The lateral walls 47a to 47d each have a flat plate shape substantially vertical. The base board 47f has a flat plate shape substantially horizontal. The treating section 33 is defined by the lateral walls 47a to 47d, and the base board 47f. The lateral walls 47a and 47c extend in the front-back direction X. The lateral wall 47c is provided so as to face the lateral wall 47a. The lateral walls 47b and 47d extend in the transverse direction Y. The lateral walls 47b and 47d each extend from the lateral wall 47a to the lateral wall 47c. The lateral wall 47d is provided so as to face the lateral wall 47b.

Apparatus maintenance is performed to the treating unit 19 having the construction described above from a side adjacent to the lateral wall 47c. That is, a face of the lateral wall 47c corresponds to the "front side face" in the present invention. In the description hereinunder, the front side face is denoted by the numeral MS.

The treating section 33 has a substrate transportation port 39. The substrate transportation port 39 is formed in the lateral wall 47a. A substrate W can pass through the substrate transportation port 39. The substrate W moves between outside of the treating section 33 and inside of the treating section 33 via the substrate transportation port 37. The treating units 19 each have a shutter, not shown. The shutter is attached to the lateral wall 47a. The shutter opens and closes the substrate transportation port 39.

The treating section 33 includes the mount table 31. The mount table 31 is installed inside of the treating section 33. The mount table 31 holds one substrate W in a horizontal posture. One substrate W is placed on a top face of the mount table 31. The mount table 31 may hold a lower face of the substrate W by vacuum adsorption, for example. Moreover, the mount table 31 may include a spin base, and three or more retaining pins standing on the spin base. In this case, the three or more retaining pins sandwich a side face of the substrate W for holding the substrate W while keeping a clearance between the spin base and the substrate W. Here, FIG. 1 shows the substrate W placed on the mount table 31 by dotted lines. The mount table 31 is rotatably driven by a rotation drive device such as an electric motor, not shown, around a rotary shaft in the vertical direction Z. The mount table 31 is surrounded by a guard 49. The guard 49 prevents scattering of a treatment liquid from the substrate W placed on the mount table 31 to the surrounding.

As shown in FIG. 6, the treating section 33 includes three nozzles 51, 53, and 55, for example. The nozzle 51 includes a proximal end 51a, an eject part 51b, and an arm 51c. The first fluid is supplied to the proximal end 51a from the first supplying section 41. The proximal end 51a is located adjacent to a lateral side of the first supplying section 41. The eject part 51b is in fluid communication with the proximal end 51a. The arm 51c couples the proximal end 51a with the eject part 51b. The proximal end 51a holds the arm 51c in a swingable manner. The proximal end 51a is swung by a drive device, not shown, around an axis in the vertical direction Z. The nozzle 51 is positioned in the standby condition such that the arm 51c runs along the lateral wall 47b. The nozzle 51 is positioned in the standby condition such that the eject part 51b is located at the standby position laterally away from the mount table 31. The nozzle 51 is positioned in the supply condition such that the eject part 51b is located at the supply position above the mount table 31.

The nozzle 53 includes a proximal end 53a, an eject part 53b, and an arm 53c. The second fluid is supplied to the proximal end 53a from the second supplying section 45. The proximal end 53a is located adjacent to a lateral side of the second supplying section 45. The eject part 53b is in fluid communication with the proximal end 53a. The arm 53c couples the proximal end 53a with the eject part 53b. The proximal end 53a holds the arm 53c in a swingable manner. The proximal end 53a is rotatable by a drive device, not shown, around an axis in the vertical direction Z. The nozzle 53 is positioned in the standby condition such that the arm 53c runs along the lateral wall 47c as shown in FIG. 6. The nozzle 53 is positioned in the standby condition such that the eject part 53b is located at the standby position laterally away from the mount table 31 as shown in FIG. 6. The nozzle 53 is positioned in the supply condition such that the eject part 53b is located at the supply position above the mount table 31.

The nozzle 55 includes a proximal end 55a, an eject part 55b, and an arm 55c. The third fluid is supplied to the proximal end 55a from the third supplying section 46. The proximal end 55a is located adjacent to a lateral side of the second supplying section 45 and the third supplying section 46. The eject part 55b is in fluid communication with the proximal end 55a. The arm 55c couples the proximal end 55a with the eject part 55b. The proximal end 55a holds the arm 55c in a swingable manner. The proximal end 55a is rotatable by a drive device, not shown, around an axis in the vertical direction Z. The nozzle 55 is positioned in the standby condition such that the arm 55c runs along the lateral wall 47d. The nozzle 55 is positioned in the standby condition such that the eject part 55b is located at the standby position laterally away from the mount table 31. The nozzle 55 is positioned in the supply condition such that the eject part 55b is located at the supply position above the mount table 31.

The proximal ends 51a, 53a, and 55a are positioned closer to the lateral wall 47c than the mount table 31 in the transverse direction Y. That is, the proximal ends 51a, 53a, and 55a are positioned closer to the front side face MS than the mount table 31. Moreover, seen from the front side face MS, the proximal ends 51a, 53a, and 55a are positioned so as not entirely but partially overlap one another. In other words, the center portions of the proximal ends 51a, 53a, and 55a where the pipes are inserted do not overlap one another seen from the front side face MS. Accordingly, the pipes and the like of the proximal ends 51a, 53a, and 55a, which are to be mentioned later, are positioned so as not to overlap one another in the front-back direction X seen from the front side face MS. Consequently, there is no possibility that the pipes and the like of the proximal ends 51a, 53a, and 55a are hard to see upon maintenance.

The treating section 33 includes standby pods 57 individually below the eject parts 51b, 53b, and 55b while the nozzles 51, 53, and 55 are at the standby position. The standby pods 57 collect dummy-dispensed fluids and the like from the eject parts 51b, 53b, and 55b of the nozzles 51, 53, and 55.

In the present embodiment, the proximal ends 51a, 53a, and 55a are arranged in such a manner as described above, and thus the pipes from the first supplying section 41, the second supplying section 45, and the third supplying section 46, respectively, can be shortened. This can also reduce lengths of circulation pipes (supplying pipe 67 and return pipe 79), which are to be mentioned later. As a result, when these pipes are subjected to temperature control, temperature control can be stably performed. Moreover, since a pre-dispense amount to the standby pod 57 before supply to a product can be reduced, consumption of the treatment liquid can be suppressed.

Here, the nozzle 51 described above corresponds to the "first nozzle" in the present invention, and the nozzle 53 corresponds to the "second nozzle" in the present invention.

First Supplying Section 41

Figure 7:
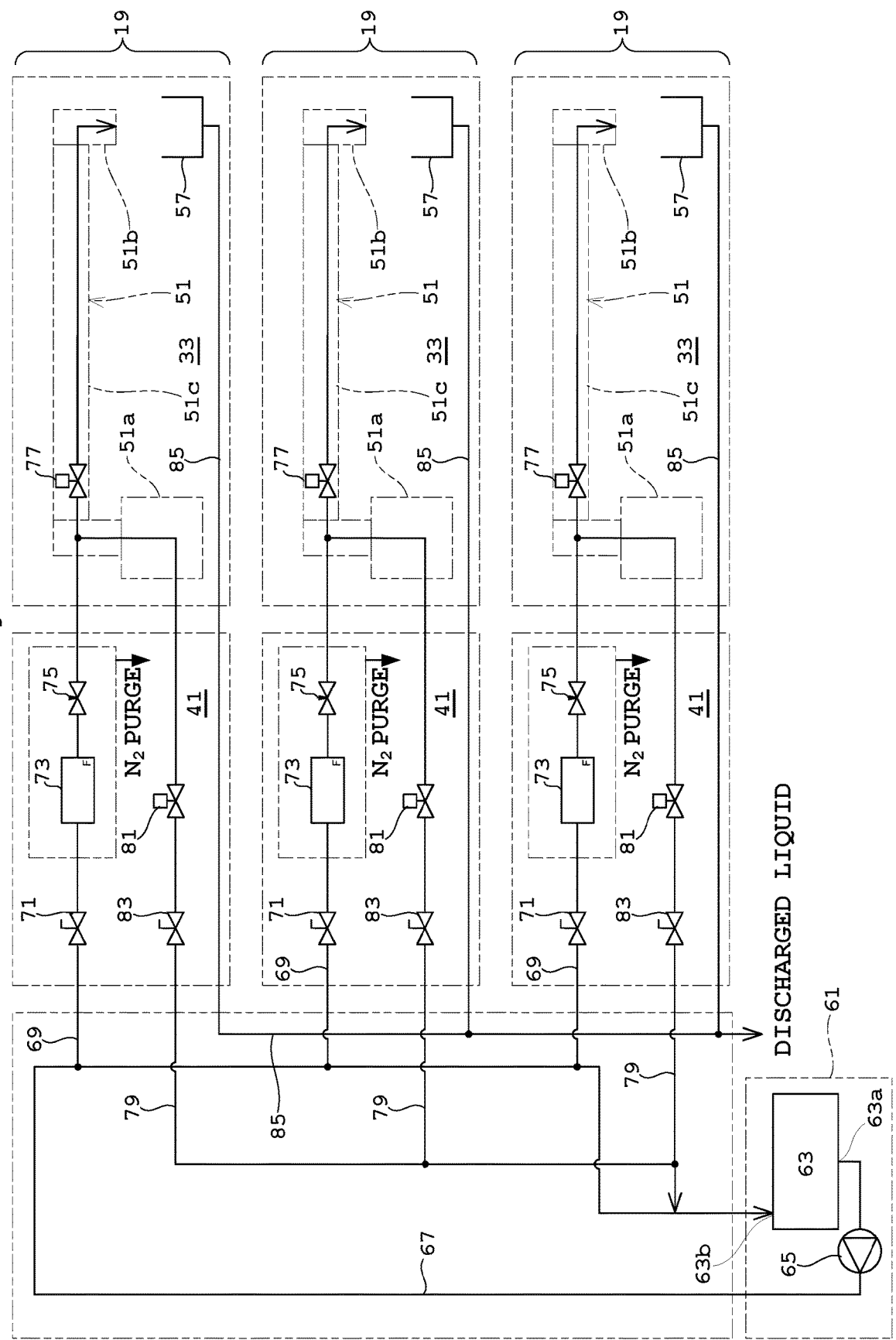
FIG. 7 schematically illustrates a supply system of a first supplying section.

Reference is now made to FIGS. 6 and 7. FIG. 7 schematically illustrates a supply system of the first supplying section. Here in FIG. 7, such a construction that the three treating units 19 each include a treating section 33 is shown for convenience of illustration. As shown in FIG. 4, such a construction that the six treating units 19 each include a treating section 33 is similar to the above.

The first supplying section 41 includes a shielding container 59. The shielding container 59 shields the internal atmosphere from the surroundings. In the shielding container 59, gas inside is purged by inert gas. The inert gas is, for example, nitrogen gas. The first fluid is supplied to the first supplying section 41 from the reservoir 61. The reservoir 61 includes a tank 63 and a pump 65. The tank 63 stores the first fluid. The pump 65 feeds out the first fluid within the tank 63. The tank 63 includes a feed portion 63a that is in fluid communication with one end of the supplying pipe 67. The pump 65 is located in the supplying pipe 67. The pump 65 feeds out the first fluid within the tank 63 to the supplying pipe 67. The tank 63 includes a return portion 63b that is in fluid communication with the other end of the supplying pipe 67.

The supplying pipe 67 is in fluid communication with first ends of three supply branch pipes 69. Second ends of the supply branch pipes 69 are in fluid communication with the proximal ends 51a individually. The second ends of the supply branch pipes 69 are in fluid communication with eject parts 51b individually via the proximal ends 51a. The supply branch pipe 69 includes a manual on-off valve 71, a flow meter 73, a flow rate regulating valve 75, and a supply control valve 77 in this order from a position adjacent to the supplying pipe 67 toward the eject part 51b.

The manual on-off valve 71 permits and shuts-off flow of the first fluid in the supply branch pipe 69 manually. The flow meter 75 detects a flow rate of the first fluid in the supply branch pipe 69. The flow rate regulating valve 75 regulates a flow rate of the first fluid in the supply branch pipe 69. The flow meter 73 and the flow rate regulating valve 75 are housed in the shielding container 59. Since the shielding container 59 exhausts gas inside thereof, the volatile gas of the first fluid can be prevented from stagnating in the shielding container 59. This achieves an explosion-proof configuration to perform treatment safely. The supply control valve 77 operates supply of the first fluid at the flow rate set by the flow rate regulating valve 75. The supply control valve 77 operates supply and stop of the first fluid from the eject part 51b.

A portion of the supply branch pipe 69 between the supply control valve 77 and the flow rate regulating valve 75 is in fluid communication with a first end of the return pipe 79. A second end of the return pipe 79 is in fluid communication with the return portion 63b of the tank 63 via the downstream side of the supplying pipe 67. The return pipe 79 includes a return on-off valve 81 and a manual on-off valve 83. The return on-off valve 81 is located on the return pipe 79 adjacent to the supply control valve 77. The manual on-off valves 71, 83 and the flow rate regulating valve 75 are located at a position in the treating unit 19 that is easy for an operator to access in maintenance from the front side face MS (adjacent to the lateral wall 47c), i.e., at a position adjacent to the front side face MS. Arrangement of the supply branch pipe 69 from the supplying pipe 67 to the proximal end 51a is preferably set to be close to the front side face MS. Here, the position adjacent to the front side face MS corresponds to a distance from the lateral wall 47c to the substrate transportation port 39 where the operator can extend his/her hand to operate.

The standby pod 57 is in fluid communication with one end of a discharge pipe 85. A second end of the discharge pipe 85 is in fluid communication with a discharged liquid treating unit not shown. The standby pod 57 collects the first fluid discharged from the eject part 51b when the nozzle 51 is located at the standby position. The first fluid collected in the standby pod 57 is discharged through the discharge pipe 85.

A controller 87 electrically operates open and close of the flow rate regulating valve 75, the supply control valve 77, and the return on-off valve 81 described above with electric signals. The controller 87 is formed by a CPU and a memory, for example. The controller 87 rotates the mount table 31 described above, and also supplies the second fluid and the third fluid from the second supplying section 45 and the third supplying section 46, respectively. The controller 87 controls the transport mechanisms 11 and 17 described above.

Here, the tank 63 described above corresponds to the "first fluid reservoir" in the present invention, and the return pipe 79 corresponds to the "collecting pipe" in the present invention. Moreover, the manual on-off valve 71 corresponds to the "first manual on-off valve" in the present invention, and the manual on-off valve 83 corresponds to the "second manual on-off valve" in the present invention. The standby pod 57 described above corresponds to the "collecting section" in the present invention.

Second Supplying Section 45 and Third Supplying Section 46

The second supplying section 45 and the third supplying section 46 each include a configuration obtained by omitting the return pipe 79 from the first supplying section 41 described above. Accordingly, the detailed description is to be omitted about the second supplying section 45 and third supplying section 46. Now, the same construction as the first supplying section 41 is adoptable to the second supplying section 45 and the third supplying section 46. The second supplying section 45 and the third supplying section 46 are individually partitioned by a partition. However, such a partition may be omitted to arrange the second supplying section 45 and the third supplying section 46 in the same space.

Exemplary Operation of First Supplying Section 41

Figure 8:
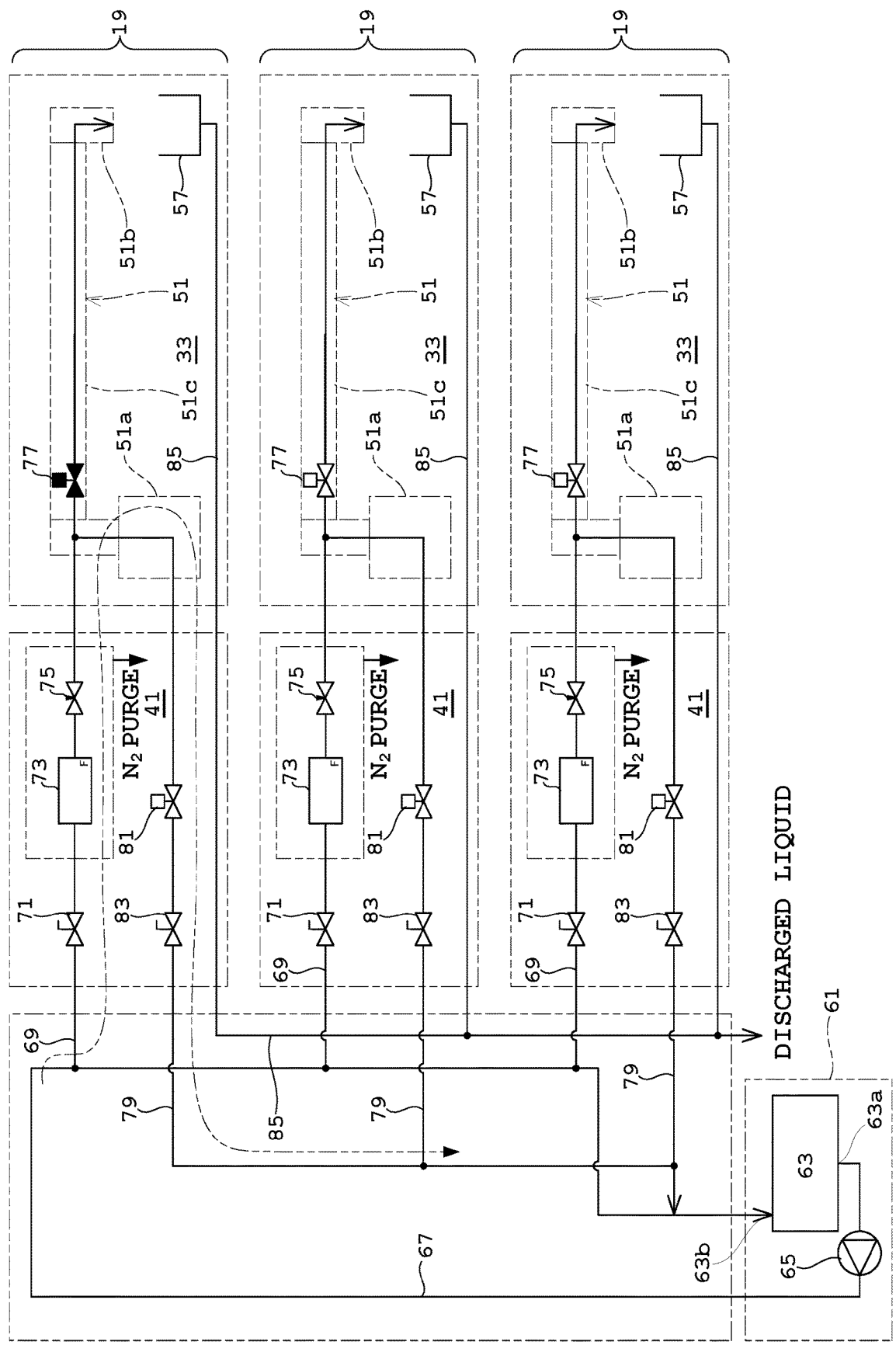
FIG. 8 schematically illustrates the first supplying section in a standby condition.
Figure 9:
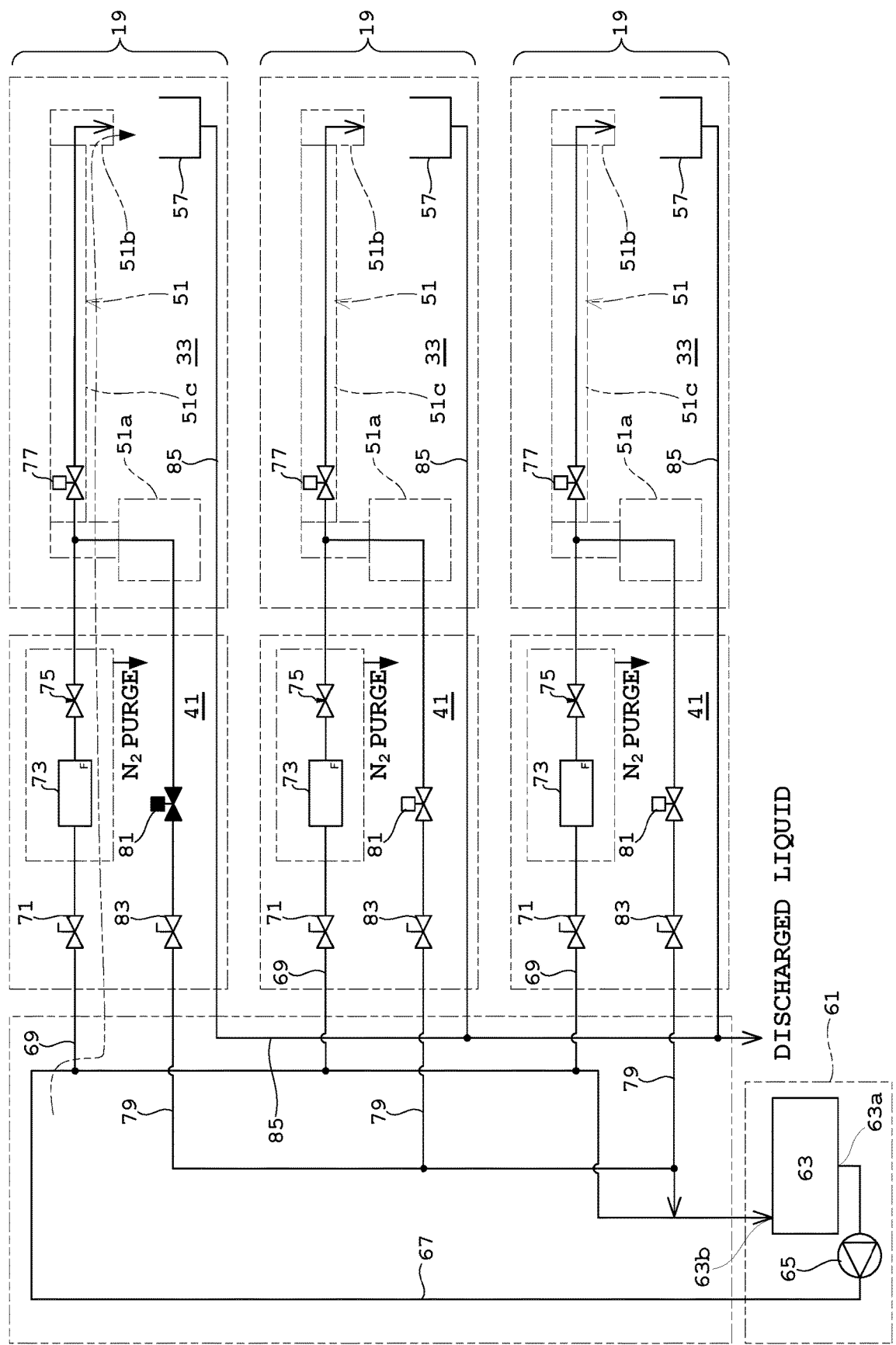
FIG. 9 schematically illustrates a case where the first supplying section supplies a first fluid.
Figure 10:
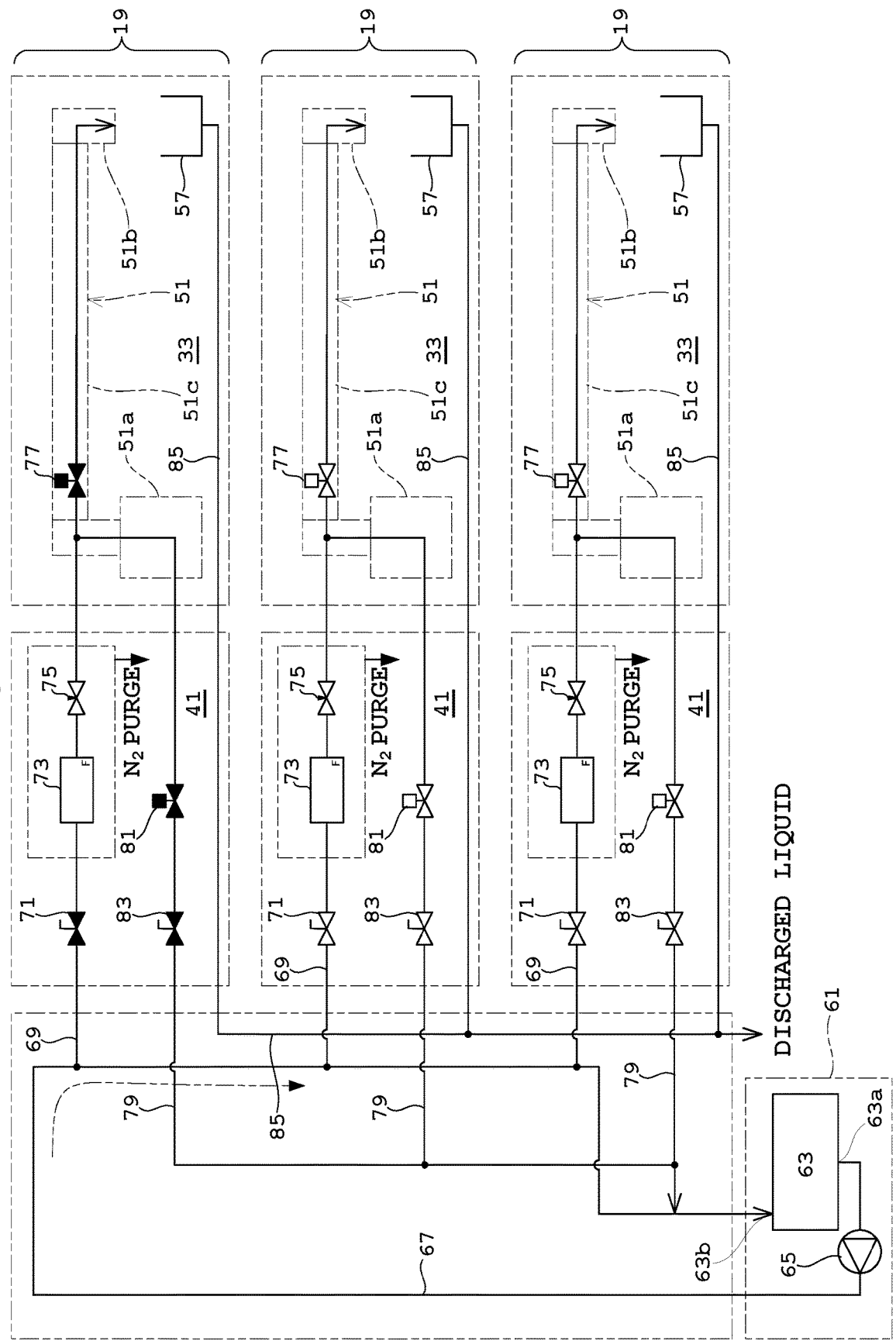
FIG. 10 schematically illustrates a case where maintenance is performed to the supply system of the first supplying section.

Reference is now made to FIGS. 8 to 10. FIG. 8 schematically illustrates the first supplying section in the standby condition. FIG. 9 schematically illustrates a case where the first supplying section supplies the first fluid. FIG. 10 schematically illustrates a case where maintenance is performed to the supply system of the first supplying section. In these drawings, a closed valve is drawn in black, and an open valve is drawn in white.

Standby Condition

When the first supplying section 41 is in the standby condition as shown in FIG. 8, the supply control valve 77 is closed. The manual on-off valves 71, 83, the flow rate regulating valve 75, and the return on-off valve 81 are open. Consequently, the first fluid supplied from the supplying pipe 67 flows back from the supply branch pipe 69 through the return pipe 79 into the tank 63. Consequently, the first fluid does not stagnate in the supplying pipe 67 and the supply branch pipe 69. In addition, when temperature control is required for the first fluid, a temperature control mechanism may be arranged in the circulation path to perform temperature control to a target temperature during circulation.

If the first fluid is isopropyl alcohol (IPA), for example, when the first fluid stagnates in the supplying pipe 67 or the supply branch pipe 69 for a long period of time, contamination may accumulate in isopropyl alcohol or components of the pipe may be eluted, leading to reduction in quality. Accordingly, isopropyl alcohol preferably circulates as described above when the nozzle 51 is located at the standby position. Consequently, there is no possibility that isopropyl alcohol stagnates in the supplying pipe 67 and the supply branch pipe 69 for a long period of time. As a result, reduction in quality of the isopropyl alcohol is suppressible, achieving treatment to substrates W with a high degree of cleanness.

Supply Condition

When the first supplying section 41 supplies the first fluid as shown in FIG. 9, the return on-off valve 81 is closed. The manual on-off valves 71, 83, the flow rate regulating valve 75, and the supply control valve 77 are open. Consequently, the first fluid supplied from the supplying pipe 67 flows through the supply branch pipe 69, and is discharged from the eject part 51b to the substrate W at the flow rate regulated by the flow rate regulating valve 75.

Maintenance Condition

When maintenance is performed to a supply system of the first supplying section 41 as shown in FIG. 10, the substrate treating apparatus 1 issues an instruction to perform the maintenance via an operation panel, not shown. Specifically, an instruction indicates which of the twenty-four treating units 19 is to be maintained. In this case, the number of instructions may be single or plural. Then, the controller 87 performs control so as to close the supply control valve 77 and the return control vale 81 in the treating unit 19 as a maintenance target. Then, the operator performs an operation from the front side face MS of the substrate treating apparatus 1, and manually closes the manual on-off valves 71, 83. Under such a condition, maintenance is performed to the supply system of the first supplying section 41. In such a condition, in the first supplying section 41 as a maintenance target, flow of the first fluid to the eject part 51b rather than to the manual on-off valve 71 is shut-off. Consequently, maintenance can be performed to the supply branch pipe 69 closer to the eject part 51b than the manual on-off valve 71, the pipes such as the return pipe 79 to the manual on-off valve 83, the flow meter 73, the flow rate regulating valve 75, and the nozzle 51.

Moreover, under such a maintenance condition, flow of the first fluid in the treating unit 19 as a maintenance target is shut-off. Accordingly, the other treating units 19 not as a maintenance target can continuously perform treatment to the substrates W. As a result, reduction in throughput of the substrate treating apparatus 1 can be suppressed while maintenance is performed to the first supplying section 41 in the treating unit 19.

As shown in FIG. 6, the substrate treating apparatus 1 described above performs treatment to the substrate W placed on the treating unit 19 by supplying an acid treatment liquid as the third fluid from the third supplying section 46, for example. In this case, the exhaust box 43 switches to feed exhaust gas to an exhaust pipe 44 which is closest to the substrate transportation port 39, of the three exhaust pipes 44, for example. In addition, the second supplying section 45 supplies an alkaline treatment liquid as the second fluid for treatment. In this case, the exhaust box 43 switches to feed exhaust gas to an exhaust pipe 44 which is centered in the horizontal direction, of the three exhaust pipes 44, for example. In addition, the first supplying section 41 supplies an organic solvent as the first fluid for treatment. In this case, the exhaust box 43 switches to feed exhaust gas to an exhaust pipe 44 which is closest to the front side face MS, of the three exhaust pipes 44, for example. In this manner, the three exhaust pipes 44 are switched depending on types of the treatment liquids. Consequently, mixing of exhaust gas containing mist of different treatment liquids can be suppressed.

According to the embodiment of the present invention, the substrate treating apparatus 1 includes the treating section 33 in the treating unit 19, and further includes the first supplying section 41 configured to supply the first fluid to the treating section 33, and the second supplying section 45 configured to supply the second fluid to the treating section 33, and the third supplying section 46 configured to supply the third fluid to the treating section 33. The first supplying section 41 is located on the first lateral side of the treating section 33, seen from the front side face in the treating unit 19, and the second supplying section 45 and the third supplying section 46 are located on the second lateral side of the treating section 33, seen from the front side face in the treating unit 19. Accordingly, none of the first supplying section 41, the second supplying section 45, and the third supplying section 46 is located on the inaccessible back side face, opposite to the front side face MS, which is hard for the operator to access in maintenance. As a result, the first supplying section 41, the second supplying section 45, and the third supplying section 46 are each made easily accessible from the front side face MS, achieving enhanced maintainability. Moreover, the first supplying section 41, the second supplying section 45, and the third supplying section 46 can each have a reduced pipe length.

The present invention is not limited to the foregoing examples, but may be modified as follows.

(1) In the embodiment described above, the substrate treating apparatus 1 has been described as one example having the three supplying sections: the first supplying section 41, the second supplying section 45, and the third supplying section 46. However, the present invention is not limitative to this construction. Specifically, the present invention may have such arrangement that at least one of the two supplying sections, like the first supplying section 41 and the second supplying section 45, or the first supplying section 41 and the third supplying section 46, is located on the first lateral side seen from the front side face MS, and the other is located on the second lateral side seen from the front side face MS.

(2) In the embodiment described above, the first fluid is an organic treatment liquid, the second fluid is an alkaline treatment liquid, and the third fluid is an acid treatment liquid. However, the present invention is not limitative to these treatment liquids. Moreover, these fluids are not necessarily different but may be the same. Moreover, such fluids are not limited to liquids but may be gas.

(3) In the embodiment described above, the flow rate regulating valve 75 is located adjacent to the front side face MS. However, such arrangement is not essential in the present invention.

(4) In the embodiment described above, the return pipe 79 is provided for circulation of the first fluid. However, such a configuration is not essential to the present invention. This achieves omission of the circulation path, leading to suppression of costs.

(5) In the embodiment described above, the manual on-off valves 71 and 83 are provided. However, the manual on-off valves 71 and 83 are not essential in the present invention.

(6) In the embodiment described above, an explosion-proof structure is adopted for the shielding container 59. However, such an explosion-proof structure by the shielding container 59 is not necessary depending on types of the fluids.

(7) In the embodiment described above, the manual on-off valves 71, 83, and the flow rate regulating valve 75 are located adjacent to the front side face MS. However, such arrangement is not essential in the present invention.

(8) In the embodiment described above, the exhaust box 43 is located adjacent to the first supplying section 41. However, such arrangement is not essential in the present invention.

(9) In the embodiment described above, the treating units 19 are stacked in multiple stages in the vertical direction Z. However, such stacked arrangement is not essential in the present invention.

(10) In the embodiment described above, the transport mechanism 11 is fixed in the transverse direction Y. However, the present invention is not limitative to this construction. That is, the transport mechanism 11 may be movable in the transverse direction Y.

(11) The embodiment above exemplarily describes the feature that the first supplying section 41 supplies an organic solvent as the first fluid for treatment. Alternatively, in the present invention, the eject part 51b may have a tubular outer peripheral surface, a first injection port, a second injection port, and a supply nozzle, for example. The first injection port is an annular injection port opened on the outer peripheral surface. The second injection port is an annular injection port opened at a position closer to a surface of the substrate than the first injection port on the outer peripheral surface. The supply nozzle is opened so as to face the substrate W at a lower face of the tubular eject part 51b. The supply nozzle ejects an organic solvent. The first injection port and the second injection port may each radially inject gas so as to spread to a peripheral edge of the substrate. Accordingly, the substrates can be protected from foreign substances such as particles and the like generated when gas from the first injection port and the second injection port reaches the substrates at cleaning treatment and the like, and splash or mist of the organic solvent, leading to suppression of contamination of the substrates. Accordingly, the substrates W can be treated with a high degree of cleanness.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for performing treatment with supply of fluids to a substrate, the apparatus comprising:
a first treatment housing;
a lateral wall provided in the first treatment housing and located toward an outer side of the apparatus, where maintenance of the apparatus is performed;
a treating section provided inside of the first treatment housing and configured to treat a substrate placed on a mount table with the fluids;
a first supplying section located on a first lateral side of the treating section, seen from the lateral wall to the first treatment housing, and configured to supply a first fluid of the fluids to the treating section; and
a second supplying section located on a second lateral side of the treating section, seen from the lateral wall to the first treatment housing, and configured to supply a second fluid of the fluids to the treating section, wherein
the first suppling section includes:
a first nozzle configured to supply the first fluid to a substrate placed on the mount table; and
a first fluid supplying section configured to supply the first fluid to the first nozzle, and
the second supplying section includes:
a second nozzle configured to supply the second fluid to a substrate placed on the mount table, and
a second fluid supplying section configured to supply the second fluid to the second nozzle,
the first nozzle includes a first proximal end configured to supply the first fluid from the first fluid supplying section, a first eject part in fluid communication with the first proximal end, and an arm connecting the first proximal end to the first eject part, the first proximal end is located closer to the first fluid supplying section than the mount table, and the first eject part swings about the first proximal end between a supply position above the mount table and a standby position away from the mount table, and
the second nozzle includes a second proximal end configured to supply the second fluid from the second fluid supplying section, a second eject part in fluid communication with the second proximal end, and an arm connecting the second proximal end to the second eject part, and the second proximal end is located closer to the second fluid supplying section than the mount table, and the second eject part swings about the second proximal end between a supply position above the mount table and a standby position away from the mount table,
the first proximal end of the fist nozzle and the second proximal end of the second nozzle are located adjacent to the lateral wall of the first treatment housing,
the first fluid supplying section is located adjacent to a third lateral side of the first proximal end of the first nozzle, and
the second fluid supplying section is located adjacent to a fourth lateral side of the second proximal end of the second nozzle.

2. The substrate treating apparatus according to claim 1, wherein
the first fluid differs from the second fluid.

3. The substrate treating apparatus according to claim 1, wherein
the first fluid and the second fluid are each a liquid.

4. The substrate treating apparatus according to claim 2, wherein
the first fluid and the second fluid are each a liquid.

5. The substrate treating apparatus according to claim 1, wherein
the first fluid supplying section includes:
a first fluid reservoir configured to store the first fluid and having a feed portion through which the first fluid is fed and a return portion through which the first fluid returns;
a supplying pipe in fluid communication with the feed portion of the first fluid reservoir;
a collecting pipe in fluid communication with the return portion of the first fluid reservoir;
a collecting section provided at the standby position for collecting the first fluid fed through the first nozzle;
a discharge pipe in fluid communication with the collecting section for discharging the first fluid collected in the collecting section;
a supply branch pipe whose one end is in fluid communication with the supplying pipe and whose other end is in fluid communication with the first proximal end;
a flow meter configured to determine a flow rate of the first fluid in the supply branch pipe;
a flow rate regulating valve provided closer to the supply branch pipe than the flow meter and configured to operate a flow rate of the first fluid in the supply branch pipe; and
a supply control valve configured to supply and stop the first fluid, adjusted with the flow rate regulating valve, through the first nozzle.

6. The substrate treating apparatus according to claim 5, wherein
the flow rate regulating valve is located adjacent to the lateral wall of the first treatment housing.

7. The substrate treating apparatus according to claim 5, wherein
the first fluid supplying section further includes:
a return pipe whose one end is in fluid communication with a portion of the supply branch pipe between the supply control valve and the flow rate regulating valve and whose other end is in fluid communication with the collecting pipe; and
a return on-off valve provided in the return pipe and configured to permit and block flow of the first fluid in the return pipe, and
when the first nozzle is at the standby position, the supply control valve closes and the return on-off valve opens to return the first fluid to the first fluid reservoir via the return pipe for circulating the first fluid.

8. The substrate treating apparatus according to claim 6, wherein
the first fluid supplying section further includes:
a return pipe whose one end is in fluid communication with a portion of the supply branch pipe between the supply control valve and the flow rate regulating valve and whose other end is in fluid communication with the collecting pipe; and
a return on-off valve provided in the return pipe and configured to permit and block flow of the first fluid in the return pipe, and
when the first nozzle is at the standby position, the supply control valve closes and the return on-off valve opens to return the first fluid to the first fluid reservoir via the return pipe for circulating the first fluid.

9. The substrate treating apparatus according to claim 7, further comprising:
- a first manual on-off valve provided in the supply branch pipe and configured to manually permit and block flow of the first fluid in the supply branch pipe; and
- a second manual on-off valve provided in the return pipe and configured to manually permit and block flow of the first fluid in the return pipe.

10. The substrate treating apparatus according to claim 5, wherein
- the first fluid is an organic solvent,
- the flow meter and the flow rate regulating valve are housed in a shielding container that shields the atmosphere in the container from the surroundings of the container, and
- the shielding container is internally exhausted.

11. The substrate treating apparatus according to claim 9, wherein
- the first manual on-off valve and the second manual on-off valve are located adjacent to the lateral wall of the first treatment housing.

12. The substrate treating apparatus according to claim 1, wherein
- an exhaust box configured to exhaust gas from the treating section is located adjacent to the first supplying section.

13. The substrate treating apparatus according to claim 1, further comprising:
- a second treatment housing located below the first treatment housing, and
- the second treatment housing includes:
  - a second treating section provided inside of the second treatment housing and configured to treat a substrate placed on a mount table with the fluids;
  - a first fluid supplying section located on a first lateral side of the second treating section, seen from a lateral wall where maintenance is performed to the second treatment housing, and configured to supply a first fluid of the fluids to the second treating section; and
  - a second fluid supplying section located on a second lateral side of the second treating section, seen from the lateral wall, and configured to supply a second fluid of the fluids to the second treating section.

14. The substrate treating apparatus according to claim 1, wherein
- the treating section includes the mount table where the substrate is placed, and
- the first lateral side is positioned opposite to the second lateral side across the mount table.

* * * * *